United States Patent [19]
Codama

[11] Patent Number: 6,091,196
[45] Date of Patent: Jul. 18, 2000

[54] ORGANIC ELECTROLUMINESCENT DISPLAY DEVICE AND METHOD OF MANUFACTURE THEREOF

[75] Inventor: Mitsufumi Codama, Tokyo, Japan

[73] Assignee: TDK Corporation, Tokyo, Japan

[21] Appl. No.: 09/170,087

[22] Filed: Oct. 13, 1998

Related U.S. Application Data

[63] Continuation of application No. PCT/JP98/00501, Feb. 6, 1998.

[30] Foreign Application Priority Data

Feb. 10, 1997 [JP] Japan ...................................... 9-41663

[51] Int. Cl.$^7$ ...................................................... H01J 1/62
[52] U.S. Cl. .............................. 313/504; 313/503; 445/9; 445/24
[58] Field of Search ................................... 313/504, 503, 313/463; 445/9, 10, 12, 14, 15, 11, 24

[56] References Cited

U.S. PATENT DOCUMENTS 6,010,742   1/2000   Tanabe et al. .......................... 313/506

FOREIGN PATENT DOCUMENTS

| | | |
|---|---|---|
| 61-92978 | 6/1961 | Japan . |
| 64-13693 | 1/1964 | Japan . |
| 2-135694 | 5/1990 | Japan . |
| 6-52991 | 2/1994 | Japan . |
| 9-274988 | 10/1997 | Japan . |

*Primary Examiner*—Nimeshkumar D. Patel
*Assistant Examiner*—Todd Reed Hopper
*Attorney, Agent, or Firm*—Oblon, Spivak, McClelland, Maier & Neustadt, P.C.

[57] ABSTRACT

In a process for the fabrication of an organic EL display device having, on the surface of a substrate 1, a terminal electrode 3, a first electrode 2, an insulating layer 4 covering a portion of the first electrode 2, an organic functional layer 5 including a light-emitting layer, and a second electrode 6 including an interconnect layer 62, after forming the first electrode 2, the terminal electrode 3, and the insulating layer 4, a mask 8 for restricting the layer-forming region is placed on the substrate 1, then the organic functional layer 5 is formed, following which the interconnect layer 62 is formed by a process having a better step coverage than the process used to form the organic functional layer 5 such as to bring the interconnect layer 62 into contact with at least part of the terminal electrode 3. When the organic functional layer 5 and the second electrode 6 are formed in succession, the second electrode 6 and the terminal electrode 3 can be reliably connected without changing the mask 8. Moreover, the organic functional layer 5 and an "electrode layer 61 containing a low work function metal" within the second electrode 6 can be protected from moisture, oxygen, and organic solvents.

9 Claims, 7 Drawing Sheets

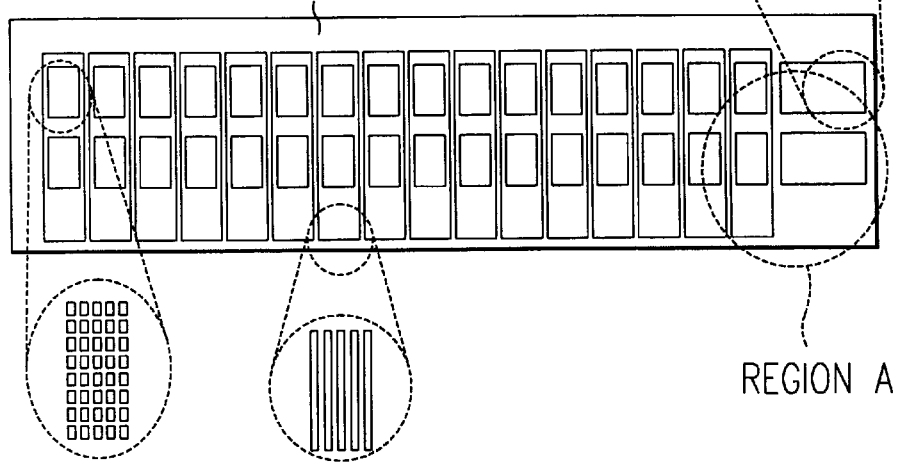
FIG. 5A(1)  FIG. 5A(2)
CHARACTER DISPLAY REGION
TERMINAL PORTION 21 OF FIRST ELECTRODE 2
TERMINAL ELECTRODE 3 CONNECTED TO SECOND ELECTRODE 6
REGION A
FIG. 5A(3)  FIG. 5A(4)
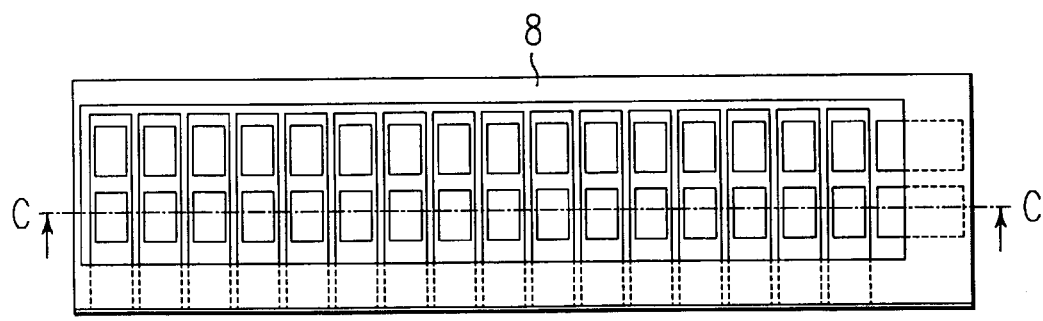
FIG. 5B
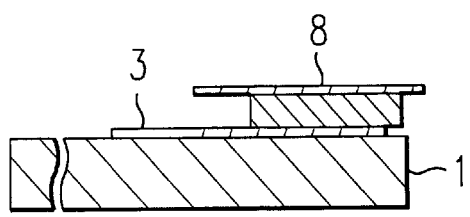
FIG. 5C

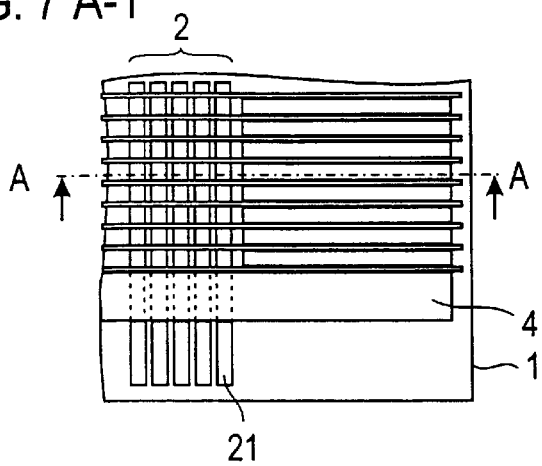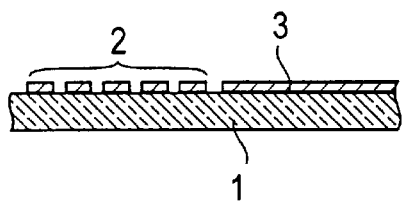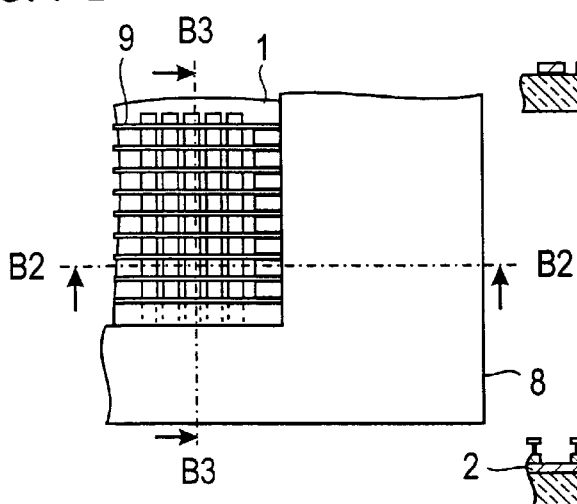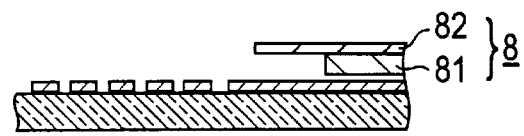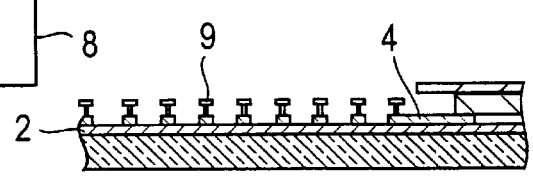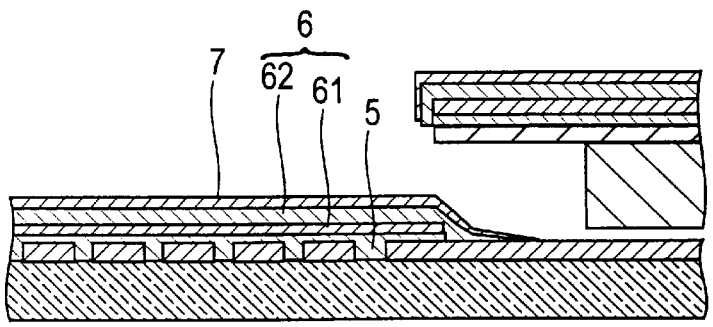

ORGANIC ELECTROLUMINESCENT DISPLAY DEVICE AND METHOD OF MANUFACTURE THEREOF

This application is a continuation of Ser. No. PCT/JP98/00501 filed Feb. 6, 1998.

TECHNICAL FIELD

The present invention relates to the method of manufacture and the construction of an organic electroluminescent (EL) display device for use in displays, light sources and the like.

BACKGROUND ART

Organic EL elements have a basic construction comprising a substrate made of glass or the like, on which are stacked a first electrode, an organic functional layer including a light-emitting layer, and a second electrode.

Display devices which use organic EL elements have the following sorts of advantages over the liquid-crystal displays that currently represent the mainstream in flat panel displays.
1) They are self-emissive, so the viewing angle is wider.
2) Displays only 2–3 mm thick can easily be manufactured.
3) A polarizing plate is not used, so the color of the emitted light is natural.
4) The broad dynamic range in brightness results in a crisp, vibrant display.
5) They operate over a broad range in temperature.
6) The response rate is more than three orders of magnitude faster than liquid-crystal displays, easily enabling the display of moving images.
7) A very high luminance of from several 100 to about 1,000 $cd/m^2$ can be obtained at a voltage of about 10 V.

However, there are number of difficult problems associated with the manufacture of EL elements, such as the ease with which the organic functional layer is degraded by moisture, oxygen and the like, the ready solubility of the organic functional layer in organic solvents, and the low resistance of this layer to heat. It is then a common practice to seal a luminescent laminate comprising a first electrode, an organic functional layer, and a second electrode with a sealing means composed of a stable material (e.g., a resin film, a metal film, an inorganic film, or a glass sheet).

In cases where organic EL elements are utilized in display devices, they generally have a construction in which a terminal electrode for connection to an external circuit is provided outside of the sealing means, and the second electrode and the terminal electrode are connected.

A method known as "masked film formation" is generally used to lead the second electrode out of the sealing means. Masked film formation is a method involving the steps of placing a mask having a shielding portion for restricting the film-forming region on a substrate or device and effecting deposition, thereby forming a film on the desired region of the substrate.

Using this method, the second electrode and the terminal electrode can be connected by the following procedure. First, an organic functional layer is formed on the substrate using a mask having an opening which corresponds to the organic functional layer-forming region. This is done in such a way that at least part of the terminal electrode is covered by the shielding portion of the mask. Next, before forming the second electrode, this mask is exchanged for a mask having an opening which corresponds to the second electrode-forming region (i.e., a mask having an opening larger than the mask used to form the organic functional layer), and the second electrode is formed. The second electrode thus formed extends beyond the organic functional layer-forming region. In this way, connection of the second electrode with the terminal electrode is accomplished.

However, the following problems are associated with the process of changing the mask following formation of the organic functional layer.

Because the mask is generally changed manually, this is done under normal atmospheric conditions. For example, in a case where the second electrode is itself used as the interconnect layer, after forming the organic functional layer, the substrate is returned to atmospheric conditions, the mask is changed, then the substrate is returned once again to the vacuum film-forming apparatus whereupon the second electrode is formed. Since this process allows moisture to be adsorbed onto the surface of the organic functional layer that is exposed to the atmosphere or be taken up at the interior of the layer, a decline occurs in the adhesion or electrical connection at the interface between the second electrode and the organic functional layer, necessitating a higher driving voltage when inducing light emission. Moreover, dark spots arise. These are defects involving an increase in the non-emissive regions at the edges of and within the light-emitting area. Another major drawback of this process is that foreign particles such as dust tend to settle on the organic functional layer, which also results in the formation of dark spots.

Although it is possible to change the mask using a robot or the like so as not to break the vacuum, the positioning mechanism in a vacuum is very large and elaborate, considerably increasing the cost of the film-forming apparatus. If such a positioning mechanism is not used, misalignment occurs, making it necessary to provide a wide margin. To the user of the display device, this appears as an area which does not luminesce, so that the region which could indeed be regarded as unnecessary becomes quite large. Moreover, in cases where a plurality of display devices are built onto a single substrate, providing a wide margin directly leads to a decline in the number of available devices, as a result of which the production cost per display device rises.

Another approach involves mounting the mask in the film-forming apparatus, but here too a large margin is required. Moreover, the mask is used over the course of many film-forming operations, dust particles are very often generated. These become major factors in lowering yields. This is no question that using a mask having a consistently high degree of cleanliness is desirable for improving yield.

However, it is customary to use the second electrode in an organic EL element as the cathode for injecting electrons. Because the cathode contains a metal having a low work function, it is highly susceptible to deterioration or corrosion by moisture, oxygen, and the like. Hence, it is preferable to use as the second electrode a laminate comprising an electrode layer of a low work function metal and a conductive layer of a more stable metal thereon.

It is sometimes desired to connect the second electrode with an external circuit by such means as wire bonding or press bonding using a heat seal connector or flexible printed circuit (FPC) connector. However, almost all such methods require mechanical strength and heat resistance at the connection between the second electrode and the terminal electrode. If the second electrode has a laminated structure comprising a corrodable electrode layer and a stable conductive layer, any damage to the conductive layer exposes the electrode layer and facilitates corrosion of the electrode layer. It is then desirable that an interconnect portion of the second electrode which extends to the terminal electrode be formed entirely from the stable conductive layer.

In cases where a second electrode having the above laminated structure is formed using the masked film formation process mentioned earlier, forming the respective layers by the method described below is advantageous for protecting the organic functional layer and the corrodable electrode layer from oxygen and moisture. In this method, first the mask is set in place and the organic functional layer, the corrodable electrode layer, and the stable conductive layer are successively formed. Next, the vacuum is broken and the mask is replaced with a mask having a larger opening, following which the vacuum is restored and a stable conductive layer is additionally laminated. Defects do not readily arise with this method because only the uppermost, conductive layer is connected to the terminal electrode, and neither the organic functional layer nor the corrodable electrode layer come into direct contact with the atmosphere. However, this approach does require that the vacuum first be returned to atmospheric pressure then later restored, and also that a stable conductive layer be formed twice, thus increasing the length of the manufacturing process and raising production costs.

DISCLOSURE OF THE INVENTION

The present invention was conceived in light of the foregoing circumstances. A first object of the present invention is to provide a method for the manufacture of an organic electroluminescent display device having a terminal electrode and a luminescent laminate on a substrate surface, which luminescent laminate comprises a first electrode, an organic functional layer including a light-emitting layer, and a second electrode, in which method, when the organic functional layer and the second electrode are formed in succession, the second electrode and the terminal electrode are reliably connected without changing the mask for restricting the layer-forming region. A second object of the present invention is, in addition to the achievement of the first object, to protect the organic functional layer and an "electrode layer containing a low work function metal" within the second electrode from moisture, oxygen, organic solvents and the like.

The foregoing objects are achieved by one of the following constructions (1) to (6).

(1) An organic electroluminescent display device comprising a luminescent laminate and a terminal electrode on a substrate surface, wherein the luminescent laminate has, in order, a first electrode, an insulating layer covering part of the first electrode, an organic functional layer including a light-emitting layer, and a second electrode comprised of at least one conductive layer, and the at least one conductive layer comprising the second electrode is an interconnect layer which is in contact with at least part of the terminal electrode, and which has a slope at the end of not more than 0.1, at least in the vicinity of the terminal electrode.

(2) The organic electroluminescent display device of (1) above, wherein the interconnect layer contains argon and the organic functional layer contains substantially no argon.

(3) A method of manufacturing an organic electroluminescent display device comprising a luminescent laminate and a terminal electrode on a substrate surface, wherein the luminescent laminate has, in order, a first electrode, an insulating layer covering part of the first electrode, an organic functional layer including a light-emitting layer, and a second electrode comprised of at least one conductive layer, and the at least one conductive layer of the second electrode is an interconnect layer in contact with the terminal electrode, the method comprising the steps of forming a first electrode, an insulating layer, and a terminal electrode; subsequently placing the substrate so that the surface side faces a mask having a shielding portion for restricting the layer-forming region and an opening surrounded thereby; forming an organic functional layer; then forming an interconnect layer by a process having a better step coverage than the process used to form the organic functional layer such as to bring the interconnect layer into contact with at least part of the terminal electrode.

(4) The method of manufacturing an organic electroluminescent display device of (3) above, wherein the substrate is placed on the mask in such a way that the shielding portion of the mask covers at least part of the terminal electrode across an intervening space.

(5) The method of manufacturing an organic electroluminescent display device of (3) or (4) above, wherein the organic functional layer is formed by a vacuum evaporation process and the interconnect layer is formed by a sputtering process.

(6) The method of manufacturing an organic electroluminescent display device of any one of (3) to (5) above, wherein the at least one conductive layer comprising the second electrode is made of a metal having a work function of not more than 4 eV.

OPERATION AND EFFECTS

The main features of the present invention are described below.

As shown in FIGS. 2A to 2F, a first electrode 2, a terminal electrode 3, and an insulating layer 4 are formed, following which a mask 8 is placed such that the terminal electrode 3 is covered by a shielding portion 81 of the mask 8. At this point, a space is provided between the shielding portion 81 and the terminal electrode 3 so that they do not come into contact.

Next, an organic functional layer 5 is formed by a process having relatively poor step coverage, that is, a process providing poor lateral spread (e.g., vacuum evaporation). Formation of the organic functional layer 5 is restricted by the shielding portion 81, and so the organic functional layer 5 does not form in the region covered by the shielding portion 81.

Next, a second electrode 6 comprising an electrode layer 61 and an interconnect layer 62 is formed without removing the mask 8. Of the second electrode 6, at least the interconnect layer 62 is formed as a film by a process having a better step coverage than the film-forming process used to form the organic functional layer 5, that is, a process providing better lateral spread (e.g., sputtering). Since the space is provided between the substrate 1 and the mask 8, the interconnect layer 62 which is formed by a process providing good step coverage enters this space as shown in FIG. 2E, thus extending beyond the organic functional layer 5 and contacting the terminal electrode 3. With this method, the second electrode 6 and the terminal electrode 3 can be electrically connected without changing the mask 8 following formation of the organic functional layer 5.

Mask 8 is not removed until the formation of the second electrode 6 has been completed. In cases where a protective layer is formed over the second electrode 6 by a process such as sputtering or vacuum evaporation, it is preferable that the mask 8 not be removed and that the vacuum be maintained until formation of the protective layer is complete.

The present invention makes it possible to eliminate one of the mask mounting steps as well as one of the times that a conductive layer of stable metal is formed. Moreover, because it is no longer necessary to release the substrate to the atmosphere after formation of the organic functional layer, less adhesion of dust particles and like occurs, resulting in a better yield. Hence, production costs for organic EL display devices can be considerably reduced, and organic EL display devices having a long life can be obtained.

In the illustrated embodiment, the organic functional layer 5 is completely covered by the interconnect layer 62 and thus protected from oxygen, moisture, and the organic solvents used in the manufacturing process. Moreover, if the electrode layer 61 is formed by a process having a poor step coverage, the interconnect layer 62 can completely cover the electrode layer 61 as well. Hence, sufficient protection is possible in cases where the electrode layer 61 is an "electrode layer containing a low work function metal."

JP-A 52991/1994 describes an organic electroluminescent device having an electrode provided on the back side of an organic thin-film layer, wherein everything from at least the side walls of the electrode to the entire exposed surface of the organic thin-film layer on which the electrode is formed has been covered with a film of metal having a lower work function than the electrode. Although this device is similar to the organic EL display device of the present invention in that the electrode is covered with a metal film composed of a different material than the electrode, this reference makes no mention of the direct connection of the metal film with a terminal electrode, and gives the examples in which a lead wire extends out from the metal film. Furthermore, in the examples given in this reference, the electrode and the metal film are both formed by vapor deposition, which also differs from the present invention.

BRIEF DESCRIPTION OF THE DRAWINGS

FIGS. 1A to 1F are plan views showing steps in the fabrication of an organic EL display device.

FIGS. 3A and 3F are sectional views showing masks 8 having different structures.

FIG. 5A is a plan view of a dot matrix display, FIG. 5B is a plan view showing the positions of openings in the mask 8 in the fabrication of the dot matrix display of FIG. 5A, and FIG. 5C is a sectional view of FIG. 5B.

FIGS. 6A-2 to 6D-2 are sectional views of FIGS. 6A-1 to 6D-1.

FIGS. 7A-1 and 7B-1 are plan views illustrating the steps in the fabrication of a dot matrix display, and FIGS. 7A-2, 7B-2, 7B-3 and 7C are sectional views.

BEST MODE FOR CARRYING OUT THE INVENTION

Referring to FIGS. 1A to 1F and FIGS. 2A to 2F, the method of manufacture according to the present invention is illustrated schematically. FIGS. 1A to 1F are plan views showing an organic EL display device in the fabrication steps from the surface side of a substrate 1, and FIGS. 2A to 2F are sectional views taken along lines A—A to F—F in FIGS. 1A to 1F, respectively. It should be noted, however, that these sectional views show only the end face of the cross-section. The same applies as well for the sectional views described later.

Figure 1:
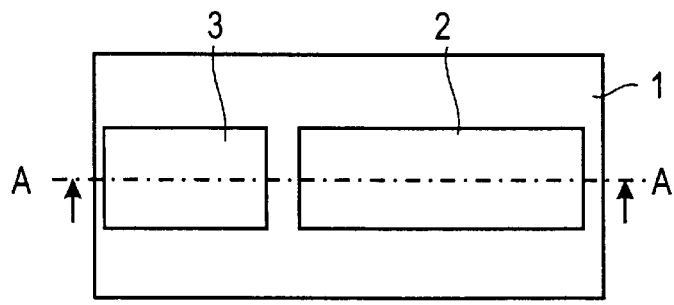
FIGS. 6A-1 to 6D-1 are plan views illustrating the steps in the fabrication of a dot matrix display.
Figure 1:
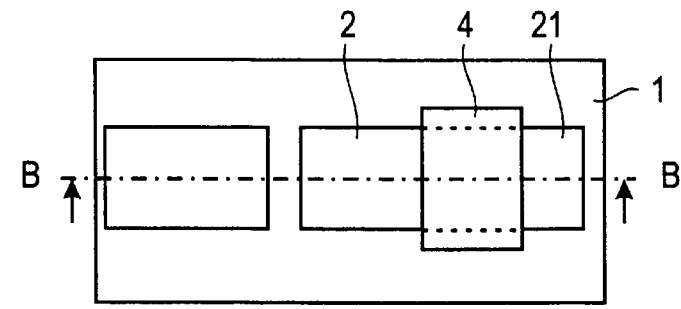
Figure 1:
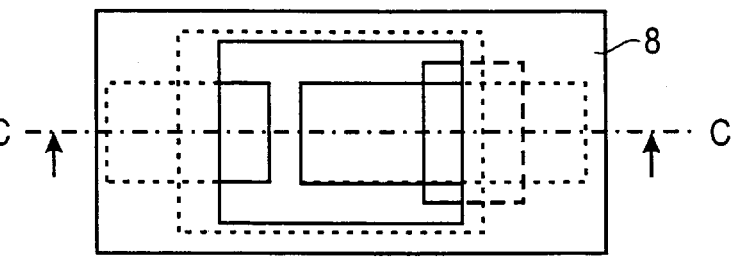
Figure 1:
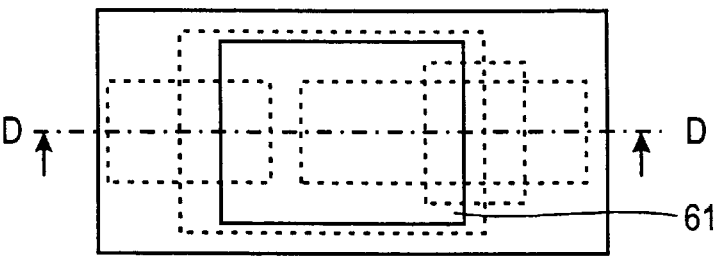
Figure 1:
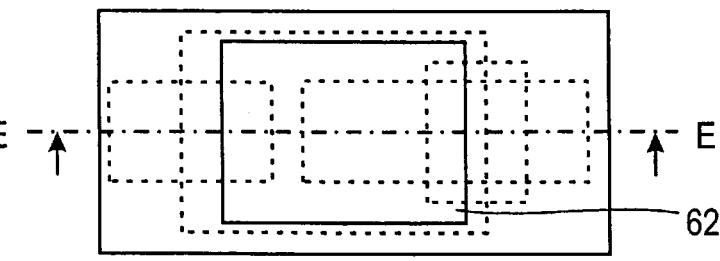
Figure 1:
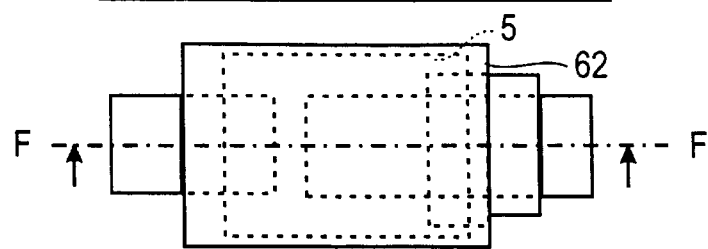
Figure 2A:
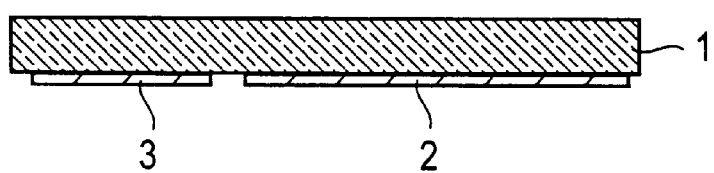
FIGS. 2A to 2F are sectional views showing steps in the fabrication of an organic EL display device.

First, as shown in FIGS. 1A and 2A, a first electrode 2 and a terminal electrode 3 are formed on a substrate 1. Here, the first electrode 2 and the terminal electrode 3 are formed at the same time, either by masking when the first electrode 2 is formed or by etching after the formation of the first electrode 2. However, the terminal electrode 3 may also be obtained by forming a conductive layer separate from the first electrode 2.

Figure 2B:
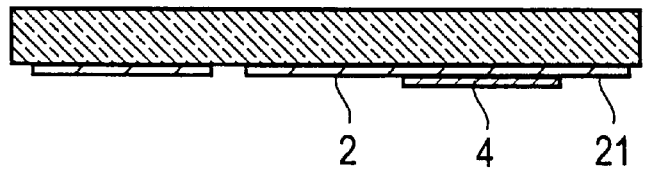

Next, as shown in FIGS. 1B and 2B, an insulating layer 4 is formed on a region of the first electrode 2 that is to become a non-emissive region. Insulating layer 4 is provided so as to keep the first electrode 2 from coming into contact with a second electrode 6 which is formed in a later step. It is essential to provide insulating layer 4 because contact between the two electrodes would result in electrical shorting across the cathode and anode of the organic EL element, which must by their very nature be kept apart. The region of the first electrode 2 which extends to the right side of the insulating layer 4 is a terminal portion 21 for connecting the first electrode 2 with an external circuit.

Figure 2C:
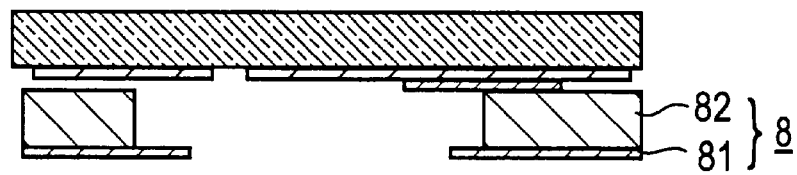

Next, referring to FIGS. 1C and 2C, the substrate 1 is placed against a mask 8. As shown in the diagram, the mask 8 is comprised of a shielding portion 81 and a base portion 82, each having different-size openings. The shielding portion 81 having a smaller opening is located on the side from which the film-forming material arrives (the bottom side in the example shown), and serves to shield the film-forming material. The base portion 82 having a smaller opening is located on the substrate 1 side, and keeps the distance between the shielding portion 81 and the substrate 1 constant. The width of coverage by the film-forming material is determined by the distance between the shielding portion 81 and the substrate 1, and by the film-forming process. In order to form the organic functional layer 5 in substantial conformity to the pattern of the mask opening and fully assure lateral spread of an interconnect layer 62, the distance between the back side of the shielding portion 81 (the substrate 1 side) and the surface of the substrate 1 is preferably set at 0.1 to 5 mm, and more preferably 0.3 to 1.5 mm. To avoid problems in the handling of the substrate 1 by an automated conveying system, the sum of the thickness of the substrate 1 and the thickness of the mask 8 (that is, the distance from the back side of the substrate 1 to the front surface of the mask 8) is set at not more than 5 mm, and more preferably not more than 3 mm. The mask 8 used herein is generally a plastic mask made of resin, or a metal mask made of a metal such as stainless steel, titanium or aluminum.

When a conventional vacuum evaporation process is used, the evaporated material which arrives at the substrate 1 is shielded by the shielding portion 81. In the conventional vacuum evaporation process, there is formed a deposited film having a pattern of the same size as the opening in the shielding portion 81. That is, conventional vacuum evaporation has a poor step coverage, with substantially no lateral spread of the depositing material. Therefore, the use of vacuum evaporation to form the organic functional layer results in the formation of an organic functional layer 5 having a pattern which corresponds to the opening in the shielding portion 81 of the mask 8.

Figure 2D:
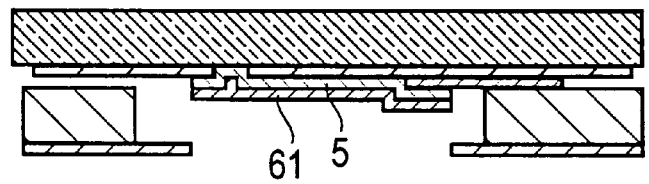
Figure 2E:
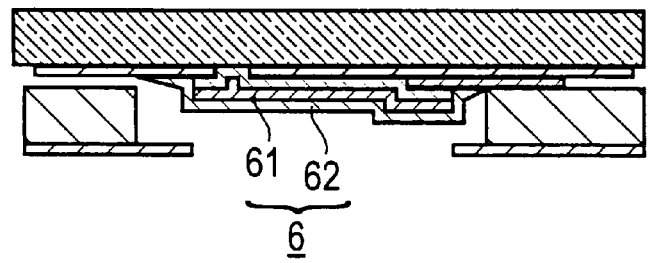

Once the organic functional layer 5 has been formed, a second electrode 6 is then formed without changing the mask 8 or breaking the vacuum. Referring to FIGS. 2D and 2E, the second electrode 6 in the illustrated embodiment comprises an electrode layer 61 formed on the surface of the organic functional layer 5, and an interconnect layer 62 formed on the surface of the electrode layer 61. The electrode layer 61 generally contains a low work function metal. Accordingly, electrode layer 61 is preferably formed by a vacuum evaporation process having poor step coverage so that it will be completely covered by the interconnect layer 62 to be formed on the surface thereof. As shown in FIG. 2D, the electrode layer 61 which has been formed by such a process has substantially the same pattern as the organic functional layer 5. After the electrode layer 61 has been formed, the interconnect layer 62 is formed by a process which is more lateral spreading than vacuum evaporation; that is, a process having good step coverage. As shown in FIG. 2E, the interconnect layer 62 formed by this type of process extends beyond the pattern of the organic functional layer 5 and electrode layer 61, spreading out to the base portion 82 side of the mask 8 and contacting the terminal electrode 3. Because a metal more stable than the material making up the electrode layer 61 is used as the material for interconnect layer 62, the connection by the second electrode 6 to the terminal electrode 3 is composed of the stable metal. Both the electrode layer 61 and the interconnect layer 62 may be comprised of a plurality of layers having different compositions.

In the illustrated example, because the entire shielding portion 81 of the mask 8 is separated from the substrate 1, the organic functional layer 5 and the electrode layer 61 are completely covered by the interconnect layer 62. However, connecting the interconnect layer 62 to the terminal electrode 3 does not require that a space between the shielding portion 81 and the substrate 1 be provided over the entire vicinity of the opening in the shielding portion 81. Then it suffices to provide a space between the shielding portion 81 and at least part of the terminal electrode 3.

Figure 2F:
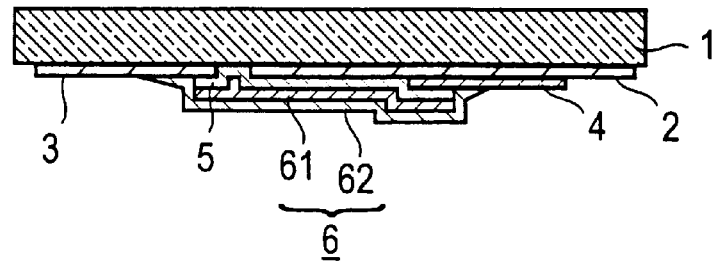

FIGS. 1F and 2F show the device after formation of the interconnect layer 62, with the mask 8 removed.

In the example described above, the second electrode 6 has a two-layer construction in which one of the layers is the interconnect layer 62. However, even when both layers are formed by processes having good lateral spread, the effects of obviating replacement of the mask 8 and protecting the organic functional layer 5 can be obtained just as in the foregoing example. Moreover, similar effects can be obtained also when the second electrode is composed of three or more layers, of which at least one is formed by a deposition process having good lateral spread. Similar effects can even be obtained when a single conductive layer serving both as the cathode or anode and as the interconnect layer is used as the second electrode, and this is formed by a process having good lateral spread. However, as noted earlier, in cases where a conductive layer of a more stable material is formed on the surface of an "electrode layer containing a low work function metal," if the stable conductive layer becomes damaged and the electrode layer is exposed, the electrode layer readily corrodes. Hence, it is preferable for only the conductive layer which is more stable than the "electrode layer containing a low work function metal" to be used as the interconnect layer.

Figure 3:
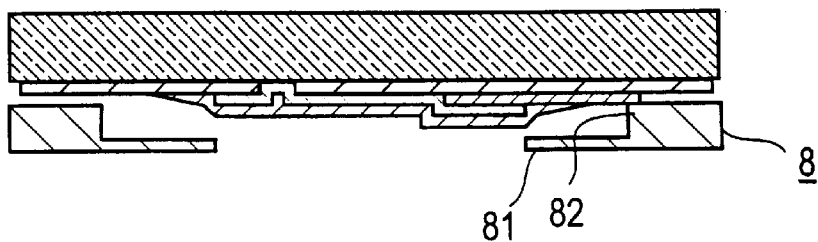
Figure 3:
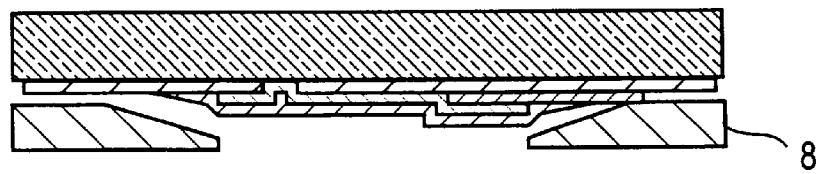

Referring to FIGS. 1A to 1F and FIGS. 2A to 2F, the mask 8 shown is comprised of two laminated members having different-size openings. However, the mask is not limited to one of this type, the use of a mask of any construction being possible so long as the opening is larger on the side opposite the substrate than on the substrate side. These include masks in which a step or a slope is provided on the inner sidewall of the shielding portion which defines the opening. Exemplary masks of this type are the mask 8 shown in FIGS. 1C to 1E and FIGS. 2C to 2E, as well as masks 8 as shown in FIGS. 3A and 3B. The mask 8 shown in FIG. 3A has the same external shape as the mask shown in FIGS. 2C to 2E, but the shielding portion 81 and the base portion 82 have been shaped from a single sheet of material. In FIG. 3B, the inner sidewall of a single-sheet mask 8 defining an opening is tapered so that the opening dilates toward the substrate 1 side.

Figure 4:
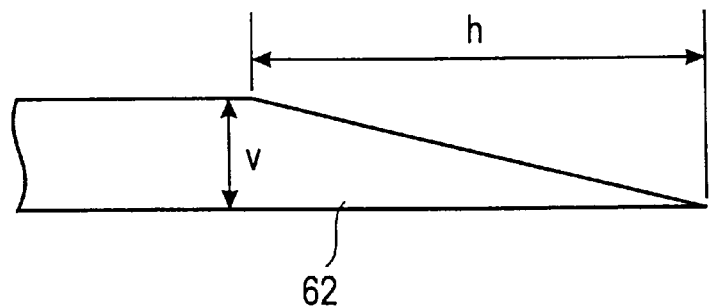
FIG. 4A is a sectional diagram showing the slope at the end of the interconnect layer 62.
FIG. 4B is a sectional diagram showing the slope at the end of the first electrode.
Figure 4:
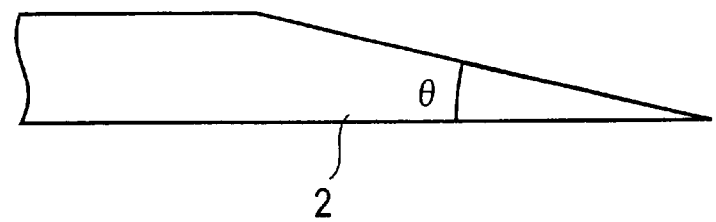

The interconnect layer which has been formed by the above-mentioned process having good step coverage generally has a moderate slope at the end of not more than 0.1. Referring to FIG. 4A, the slope at the end of the interconnect layer 62 is defined as the ratio v/h of a positional change v in a vertical direction to a positional change h in a horizontal direction. By contrast, if the interconnect layer is formed using a process having a poor step coverage (such as a conventional evaporation process) like the process used to form the organic functional layer, the ratio v/h generally becomes as great as 0.5 or more. Hence, whether or not mask replacement has been carried out between the organic functional layer forming step and the interconnect layer forming step can be determined by examining the slope at the end of the interconnect layer and the position at which that slope begins.

In the sputtering process, which was mentioned in the preceding discussion as a process having good step coverage, a higher sputtering gas pressure results in an increase in the frequency with which sputtered particles from the target collide with the sputtering gas and scatter, enhancing step coverage. Preferably, the sputtering gas pressure is selected so that a sputtered particle from the target collides with a sputtering gas atom at least once on average by the time it reaches the substrate; in other words, so that the mean free path of a sputtered particle is shorter than the distance between the target and the substrate. Too high a sputtering gas pressure results in excessive scattering of sputtered particles from the target and a decrease in the voltage applied to the target, which in turn leads to a lower rate of film formation. Accordingly, the sputtering gas pressure may be determined as appropriate while taking into account the step coverage and the rate of film formation, although it is preferably from $2 \times 10^{-4}$ to $2 \times 10^{-2}$ torr, and more preferably from $1 \times 10^{-3}$ to $1 \times 10^{-2}$ torr. Argon is generally used as the sputtering gas. Hence, whether a sputtering process has been used in the formation of a film can be confirmed by subsequent measurement of the argon content in that film. The argon content within a layer that has been formed by a sputtering process is generally about 0.01 to about 15 atom percent. Conversely, when a vapor deposition process is used, substantially no argon is present in the layer.

Processes other than sputtering which have a good step coverage include plasma chemical vapor deposition and optical chemical vapor deposition. These processes may also be used in the present invention. In addition, the step coverage in a vacuum evaporation process can be improved by introducing an inert gas such as argon into the process atmosphere, and so this too may be used to form the interconnect layer. However, the use of a sputtering process is most preferred because the best productivity and uniformity are achieved.

Even in a vacuum evaporation process, step coverage becomes good when the ambient pressure at the time of evaporation is high. Hence, in cases where it is necessary to worsen the step coverage, the pressure at the time of vapor deposition is preferably set to not more than $1 \times 10^{-5}$ torr, and more preferably not more than $1 \times 10^{-6}$ torr.

The side walls of the first electrode 2 preferably have a slope rather than being perpendicular to the substrate 1. This is to prevent coverage by the thin film subsequently formed by vapor deposition from worsening on the side walls of the first electrode 2, and thus to enhance the yield and life of the device. The angle θ (referred to hereinafter as the taper angle) that forms between the side wall of the first electrode 2 and the surface of the substrate 1 in FIG. 4B is preferably not more than 60°. A step having a small taper angle can be fashioned here by either a wet etching or dry etching process. For example, in the wet etching process wherein etching proceeds isotropically, a taper angle of 60° or less can be spontaneously achieved provided too long an overetching time is avoided, and an angle of 45° or less can easily be obtained. Even with a dry etching process, a taper angle of 20 to 30° can easily be achieved with a method that utilizes retreat of the resist by dry etching; that is, by selecting etching conditions including the dry etching gas, RF input power, and gas pressure, so that the resist taper angle may be transferred. The dry etching gas used at this time may be a hydrogen halide gas such as hydrogen chloride or hydrogen iodide, or some other suitable gas such as bromine gas or methanol.

A fuller description of the various parts of the organic EL display device is given below.

Substrate

The organic EL display device of the present invention may be constructed such that the light emitted by the organic functional layer passes out through the substrate, or it may be constructed such that the emitted light passes out from the side opposite the substrate. In the construction in which the emitted light passes out from the substrate side, a transparent or semi-transparent material such as glass, quartz or resin is used as the substrate. Inexpensive soda glass can be used in the substrate, although it is preferable in this case to apply a coat of silica over the entire surface of the substrate. The silica coat serves to protect the soda glass, which has a poor resistance to acids and alkalis, and to improve the planarity of the substrate.

A color filter film, fluorescent substance-containing color conversion film, or dielectric reflection film may be placed on the substrate to control the color of the emitted light.

If the display device has a construction in which the emitted light passes out from the side opposite the substrate, the substrate may be opaque. Examples of substrates that may be used in this case include ceramics such as alumina, metal sheets of stainless steel or the like which have been surface-oxidized or otherwise insulation treated, thermoset resins, and thermoplastic resins.

First Electrode and Second Electrode

The first electrode generally serves as the anode, and the second electrode as the cathode, although the reverse is also acceptable.

Anode

In the construction where the emitted light passes out through the anode, the anode material and thickness are selected so that preferably at least 80% of the emitted light is transmitted. Examples of materials preferable for use in the anode include tin-doped indium oxide (ITO), zinc-doped indium oxide (IZO), $SnO_2$, and polypyrrole which has been doped with a dopant. Of these, the use of ITO is especially preferred. The thickness of the anode is preferably set at about 10 to about 500 nm. No particular limit is imposed on the method of forming the anode, although the use of a sputtering process is preferable because it is capable of easily forming a large surface area film to a uniform thickness.

Cathode

Preferably, the cathode is made of a metal having a low work function, and specifically a metal having a work function of not more than 4 eV (including alloys and intermetallic compounds). Too high a work function results in a low electron injection efficiency and a low emission efficiency.

Illustrative examples of materials which can be used in cathode formation include alkali metals such as lithium, sodium and potassium; alkaline earth metals such as magnesium, calcium, strontium and barium; rare-earth metals such as lanthanum and cerium; as well as aluminum, indium, silver, tin, zinc and zirconium. One or more of these may be selected so as to obtain a cathode having the desired work function. Examples of alloys having a work function of not more than 4 eV include magnesium-silver (1 to 20 atom % silver), aluminum-lithium (0.5 to 10 atom % lithium), indium-magnesium (50 to 80 atom % magnesium), and aluminum-calcium (5 to 20 atom % calcium) alloys.

When the cathode is used as at least a portion of the second electrode, the method of formation is suitably selected according to the step coverage required.

The thickness of the cathode should be suitably set so as to enable sufficient electron injection, although this thickness is preferably at least 50 µm, and more preferably at least 100 nm. There is no particular upper limit to the cathode thickness, but a thickness greater than 500 nm is generally not necessary.

Interconnect layer

The interconnect layer is described for a case in which it is provided independently of an electrode layer (cathode or anode).

The material making up the interconnect layer in such a case is preferably selected from among electrically conductive metals (including alloys and intermetallic compounds) and electrically conductive ceramics which are more stable than the material making up the electrode layer material. Preferred examples include silver, aluminum, gold, chromium, molybdenum, platinum, titanium, and tungsten; alloys of aluminum with at least one from among copper, molybdenum, scandium, silicon, and tungsten; and TiN, ZnO, $SnO_2$, and $In_2O_3$.

The thickness of the interconnect layer is preferably from 30 nm to 1 µm, and more preferably from 50 nm to 0.5 µm. If the interconnect layer is too thin, the step coverage of the interconnect layer becomes poor, making reliable connection of the interconnect layer to the terminal electrode more difficult to achieve. On the other hand, if the interconnect layer is too thick, the stress on the layer becomes large, resulting in an increase in the growth rate of dark spots.

Terminal Electrode

Examples of terminal electrode materials that may be used include, without particular limitation, ITO, TiN, and aluminum. However, when sealing is carried out by applying a sealing sheet or the like with an adhesive following formation of the second electrode and the protective layer, in cases where a UV-curable adhesive is used and ultraviolet light is irradiated from the substrate side, it is preferable for the terminal electrode to be made of a material having a high light transmittance. The various types of materials mentioned above in the description of the anode are preferable as the electrode material in this case. In general, the terminal electrode is formed at the same time as the first electrode, this being done by the patterning process used during formation of the first electrode.

Insulating Layer

This may be any suitable layer having electrically insulating properties, such as a film obtained by sputtering or vacuum evaporating an inorganic material such as silicon oxide (e.g., $SiO_2$) or silicon nitride, a silicon oxide layer formed of spin-on-glass (SOG), or a coat of a resin-based material such as photoresist, polyimide or acrylic resin. However, because the first electrode made of ITO or the like underlies the insulating layer, it is preferable to use a material which can be patterned without causing damage to the first electrode during patterning of the insulating layer.

No limit is imposed on the thickness of the insulating layer, which may be suitably selected in accordance with the material such as to provide the required insulating properties. However, when an inorganic material is used, an insulating layer on the thin side is preferable from the standpoint of production costs.

Organic Functional Layer including Light-Emitting Layer

The light-emitting layer has the function of injecting holes and electrons, the function of transporting these holes and electrons, and the function of generating excitons by recombining holes and electrons. A compound that is relatively neutral electronically is preferably used in the light-emitting layer.

In addition to the light-emitting layer, the organic functional layer preferably includes a hole injecting and transporting layer. The hole injecting and transporting layer has the function of facilitating the injection of holes from the anode, the function of transporting holes, and the function of hindering electrons. Moreover, if necessary, when the electron injecting and transporting function of the compound used in the light-emitting layer is not very high, for example, there may be provided an electron injecting and transporting layer between the light-emitting layer and the cathode. The electron injecting and transporting layer has the function of facilitating the injection of electrons from the cathode, the function of transporting electrons, and the function of hindering holes. The hole injecting and transporting layer and the electron injecting and transporting layer increase the number of holes and electrons injected to the light-emitting layer, thus improving the emission efficiency.

The hole injecting and transporting layer is provided between the anode and the light-emitting layer, and the electron injecting and transporting layer is provided between the cathode and the light-emitting layer.

In both the hole injecting and transporting layer and the electron injecting and transporting layer, a layer having the injecting function and a layer having the transporting function may be provided separately.

No particular limits are imposed on the thickness of the light-emitting layer, the thickness of the hole injecting and transporting layer, and the thickness of the electron injecting and transporting layer. These thicknesses may vary also depending on the method of formation, but are generally set at about 5 to about 100 nm. By controlling the thickness of each layer while keeping in mind the carrier mobility and carrier density (determined by the ionizing potential and electron affinity) for each layer, the recombining regions and light-emitting regions can be freely designed, and it becomes possible to design the color of the emitted light, control the luminance and emission spectrum by the interference effects of the two electrodes, and control the space distribution of the emitted light.

A fluorescent substance which is a compound having a luminescing function is included within the light-emitting layer. Examples of fluorescent substances which may be used include metal complex dyes such as tris(8-quinolinolato)aluminum as disclosed in JP-A 264692/1988, for instance. In addition to or in place of this, use can also be made of quinacridone, coumarin, rubrene, and styryl dyes, as well as tetraphenylbutadiene, anthracene, perylene, coronene and 12-phthaloperinone derivatives. The light-emitting layer may serve also as the electron injecting and transporting layer, in which case the use of tris(8-quinolinolato)aluminum or the like is preferred.

Organic metal complexes such as tris(8-quinolinolato) aluminum, oxadiazole derivatives, perylene derivatives, pyridine derivatives, pyrimidine derivatives, quinoline derivatives, quinoxaline derivatives, diphenylquinone derivatives, nitro-substituted fluorenone derivatives, and the like may be used in the electron injecting and transporting layer. As noted above, the electron injecting and transporting layer may also serve as the light-emitting layer, in which case the use of tris(8-quinolinolato)aluminum or the like is preferred.

In cases where the electron injecting and transporting layer is provided as separate electron-injecting and electron-transporting layers, desirable combinations may be selected from among the compounds for the electron injecting and transporting layer, and used in the respective layers. It is preferable at this time to stack the layers in the order of increasing electron affinity by the compounds therein from the cathode side. This stacking order applies also when two or more electron injecting and transporting layers are provided.

Various types of organic compounds mentioned in, for example, JP-A 295695/1988, JP-A 191694/1990, JP-A 792/1991, JP-A 234681/1993, JP-A 239455/1993, JP-A 299174/1993, JP-A 126225/1995, JP-A 126226/1995, JP-A 100172/1996, and EP 0650955A1 may be used in the hole injecting and transporting layer. Examples of such compounds include tetraarylbenzidine compounds such as tetraaryl-diamines and tetraphenyldiamine (TPD), aromatic tertiary amines, hydrazone derivatives, carbazole derivatives, triazole derivatives, imidazole derivatives, amino-bearing oxadiazole derivatives, and polythiophenes. Use can also be made of two or more of these compounds together, in which case they may be stacked as separate layers or they may be mixed.

In cases where the hole injecting and transporting layer is provided as separate hole-injecting and hole-transporting layers, desirable combinations may be selected from among the compounds for the hole injecting and transporting layer, and used in the respective layers. It is preferable at this time to stack the layers in the order of decreasing ionization potential by the compounds therein from the anode side. Moreover, it is advantageous to use, in the layers provided on the anode surface, compounds capable of forming uniform thin films. This stacking order applies also when two or more hole injecting and transporting layers are provided. By adopting such a stacking order, the driving voltage can be lowered, and it is possible to prevent current leaks as well as the formation and growth of dark spots. When the layers are formed by a vapor deposition process, even a thin film having a thickness of about 1 to 10 nm can be made uniform and pinhole-free. As such, even when a compound having a low ionization potential and absorption in the visible region of the electromagnetic spectrum is used in the hole injecting layer, changes in the tint of the emitted light and a lower efficiency due to re-absorption can be prevented.

A vapor deposition or sputtering process may be used to form the respective layers constituting the organic functional layer, although, as noted above, formation by a vapor deposition process is especially preferred.

Protective Layer

The protective layer may be made of an inorganic material such as silicon oxide or silicon nitride, or an organic material such as a fluorocarbon resin.

The thickness of a protective layer made of an inorganic material is preferably from 10 nm to 0.5 $\mu$m, and the thickness of a protective layer made of an organic material is preferably from 10 nm to 100 $\mu$m. A protective layer that is too thin has an insufficient sealing effect, whereas one that is too thick results in greater stress, leading to more rapid growth of dark spots.

The protective layer may be formed by a vapor deposition process or a sputtering process, although formation by a process having good step coverage is preferred for sufficient protection of the second electrode.

Sealing

After the protective layer has been formed, it is advantageous to bond thereto a sealing sheet so as to give a structure in which a region that excludes at least part of the terminal electrode 3 is sealed between the substrate 1 and the sealing sheet. This makes it possible to prevent the infiltration of moisture, and also increases the mechanical strength. Adhesion of the sealing sheet may be carried out using a photo-curable adhesive, an epoxy adhesive, a silicone adhesive, or a crosslinked ethylene-vinyl acetate copolymer adhesive sheet, to name a few examples. Glass, ceramic, metal, resin or the like may be used as the sealing sheet.

The organic EL display device according to the present invention is not limited to the solitary-type device described above, but can be applied as well in a simple matrix-type or thin-film transistor (TFT)-type multi-pixel structure.

The organic EL display device of the invention is generally driven by direct current, although an alternating current-driven or a pulse-driven configuration is also possible. The applied voltage is usually about 5 to 20 volts.

EXAMPLE

Example 1

FIG. 5A illustrates an example in which there is fabricated a dot matrix display comprising a 2-row by 16-column array of 5×8 dot character display regions composed of dots having a pixel size of 0.4×0.6 mm. FIG. 5A also includes an enlarged view of a character display region, an enlarged view of the terminal portion 21 of the first electrode 2, and an enlarged view of the terminal electrode 3 connected to the second electrode 6. FIGS. 5B and 5C show the position of the opening in the mask 8 during the manufacturing process, with FIG. 5B being a plan view and FIG. 5C being a partially abbreviated sectional view along line C—C in FIG. 5B. It should be noted also that FIG. 5C shows the state prior to formation of the organic functional layer.

FIGS. 6A-1 to 6D-2 and FIGS. 7A-1 to 7C illustrate the manufacturing steps. For ease of understanding, these show enlarged a portion of the region A in FIG. 5A. FIGS. 6A-1, 6B-1, 6C-1, 6D-1, 7A-1, and 7A-2 are plan views from the surface side of the substrate 1. FIGS. 6A-2, 6B-2, 6C-2, 6D-2, and FIGS. 7A-2, 7B-2 and 7B-3 respectively show sectional views taken along lines A—A to D—D in FIGS. 6A-1, 6B-1, and 6D-1, and along lines A—A, B2—B2, and B3—B3 in FIGS. 7A-1 and 7B-1.

The substrate 1 used was inexpensive soda glass coated over the entire surface with silica, the purpose of this coating being to protect the soda glass, which has a low resistance to acids and alkalis, and to provide the glass surface with a good planarity.

Figure 6:
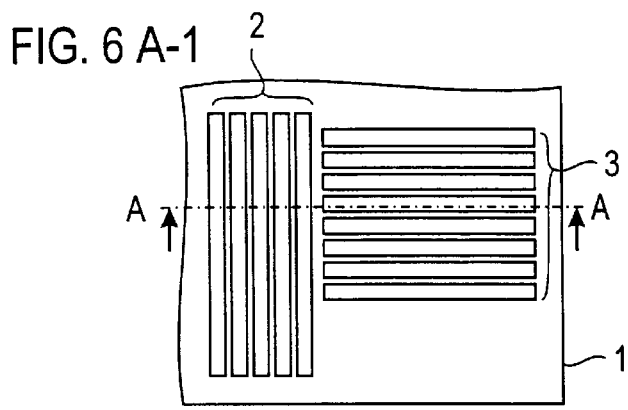
Figure 6:
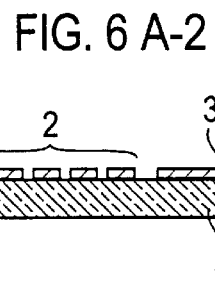
Figure 6:
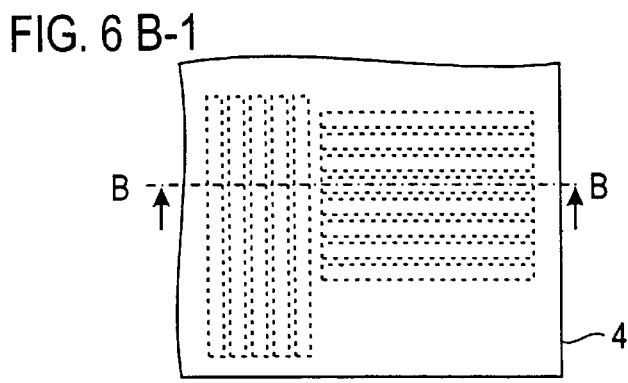
Figure 6:
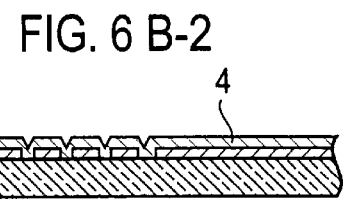
Figure 6:
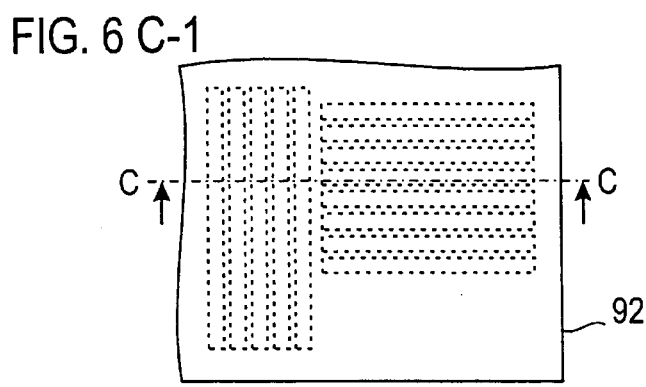
Figure 6:
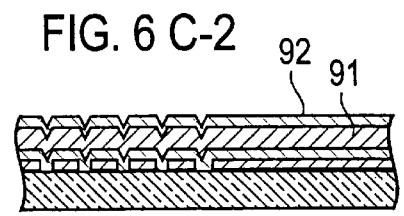
Figure 6:
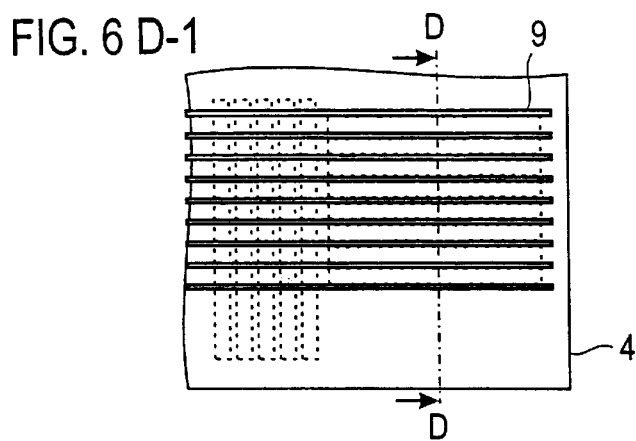
Figure 6:
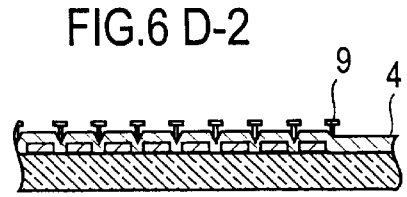

Next, a transparent conductive layer made of ITO and having a thickness of 1,000 Å was deposited by sputtering in order to form the first electrode 2 and the terminal electrode 3. A resist pattern was formed on the transparent conductive layer by photolithography, and the unnecessary portions were etched away. The resist was then stripped, thereby forming the first electrode 2 and the terminal electrode 3, as shown in FIGS. 6A-1 and 6A-2. The taper angle (angle $\theta$ shown in FIG. 43) at the side walls of the first electrode 2 and the terminal electrode 3 was set at 45°. The side walls having this taper angle were formed by 2 minutes of etching with an etchant composed of a mixture of HCl, $HNO_3$, and water.

Next, as shown in FIGS. 6B-1 and 6B-2, an insulating layer 4 covering the first electrode 2 and the terminal electrode 3 was formed over the entire surface of the substrate 1. Polyimide was used as the insulating layer 4. The polyimide selected was a non-photosensitive one, which was diluted with N-methylpyrrolidone (NMP) to a concentration of about 5% and applied by spin coating, followed by baking first at 150° C. for 30 minutes, then at 300° C. for one hour.

Next, to fabricate a structure for separation between the pixels, as shown in FIGS. 6C-1 and 6C-2, an aluminum layer 91 having a thickness of 1 $\mu$m and a chromium layer 92 having a thickness of 0.2 $\mu$m were successively formed.

A positive resist was then applied, and this was exposed and developed so as to form the desired photo pattern. The chromium layer 92 was etched with an ammonium cerium nitrate solution, and the aluminum layer 91 was etched with a mixture of phosphoric acid, nitric acid, and acetic acid. By dipping the workpiece in the etching solution for just the length of time needed to sufficiently overetch the aluminum layer 91, the aluminum pattern on each side became about 2 $\mu$m smaller than the initial photo pattern, giving tee-shaped structures (overhangs) 9 as shown in FIGS. 6D-1 and 6D-2.

Further, a pattern having openings for exposing the first electrode 2 to become the actual light-emitting region and the terminal electrode 3 was created by photolithography, and the insulating layer 4 was etched with oxygen plasma, after which the resist was stripped, thereby giving the structure shown in FIGS. 7A-1 and 7A-2.

Next, as shown in FIGS. 7B-1, 7B-2, and 7B-3, a mask 8 was placed against the substrate 1. This mask 8 was comprised of metal masks (made of SUS 304 stainless steel) of different-size openings that had been laminated together. The base portion 82 on the substrate 1 side was 1 mm thick, and the shielding portion 81 was 0.1 mm thick. The amount of overhang by the shielding portion 81 relative to the base portion 82 in the mask opening was 2 mm.

Next, as shown in FIG. 7C, the organic functional layer 5, the second electrode 6 (electrode layer 61 and interconnect layer 62), and the protective layer 7 were successively formed. The vacuum was not broken until formation of the protective layer 7 was completed, nor was the mask 8 changed.

The organic functional layer 5 was comprised of a hole injecting and transporting layer and a light emitting and electron transporting layer, each having a thickness of 500 Å. The hole injecting and transporting layer was formed by the vapor deposition of N,N'-bis(m-methylphenyl)-N,N'-diphenyl-1,1'-biphenyl-4,4'-diamine (abbreviated hereinafter as TPD). The light emitting and electron transporting layer was formed by the vapor deposition of tris(8-hydroxyquinoline)aluminum (abbreviated hereinafter as $Alq_3$). The pressure during vapor deposition of these two layers was set at $1 \times 10^{-6}$ torr.

The electrode layer 61 was formed to a thickness of 2,000 Å by the vapor deposition of a magnesium-silver alloy (weight ratio, 10:1). The pressure during vapor deposition was set at $1 \times 10^{-6}$ torr.

The interconnect layer 62 was formed to a thickness of 0.3 μm by sputtering from an aluminum target. The pressure of the sputtering gas (argon) was set at $4 \times 10^{-3}$ torr. The slope v/h at the end of the interconnect layer 62 shown in FIG. 4(A) was 0.05. The argon content within the interconnect layer 62 was about 3 atom %. The amount of argon within the electrode layer 61 was below the limit of detection.

The protective layer 7 was formed to a thickness of 0.2 μm by sputtering from a $SiO_2$ target.

Finally, after removing the workpiece from the film-forming apparatus, the mask 8 was removed, sealing was carried out so as to shut the entire assembly off from outside air, and the terminal electrode 3 and the external circuit were connected, thereby completing the dot matrix display.

Example 2

An example is now given of the fabrication of a color display in which the number of pixels was 320×240×RGB dots, each pixel having a size of 330×110 μm. Apart from the fact that this example concerns the fabrication of a color display and the pixels are smaller, there are no major differences with Example 1.

First, pigment dispersion-type color filters were formed as most commonly employed as the technique for colorizing liquid-crystal displays. A filter liquid for each of the colors was applied so as to give a filter film having a thickness of about 1.5 to about 2.5 μm, which was then patterned. The color filter formation steps were carried out as follows, using red as the color in this case. A color filter liquid for red was spin coated at 1,000 rpm for 5 seconds, then pre-baked at 100° C. for 3 minutes. In an exposure system, a photomask was positioned against the film, and the film was exposed with 20 mW of ultraviolet light for 30 seconds, following which the exposed film was developed with an aqueous TMAH solution having a concentration of about 0.1%. The development time was about 1 minute. Next, the developed film was cured at 220° C. for 1 hour to keep it from dissolving in the other color filter liquids to be applied subsequently, thereby completing formation of the red color filter pattern. Color filters for the other colors (green and blue) used different materials (pigments), and so were formed under conditions that differed somewhat from those for the above-described red color filter, although this was done by carrying out substantially the same steps in the same order. The example described here used only color filters because production was relatively simple. However, fluorescent conversion filters may be used so that green and red are output through color conversion, thereby achieving higher-luminance emission. Moreover, color filters and fluorescent conversion filters may be stacked so as to both prevent reduced luminance and enhance color purity.

Figure 8A:
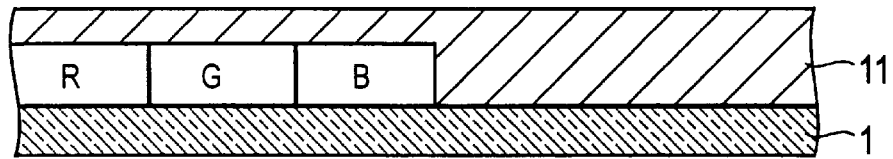
FIGS. 8A to 8E are sectional views illustrating the steps in the fabrication of a color display.

Next, as shown in FIG. 8A, an overcoating material was applied on top of the color filter pattern (R, G, and B in the diagram) and over the entire surface of the substrate 1. This was exposed, then cured at 220° C. for 1 hour to form an overcoat layer 11 which improved the planarity of the side on which the transparent conductive layer was to be formed.

Figure 8B:
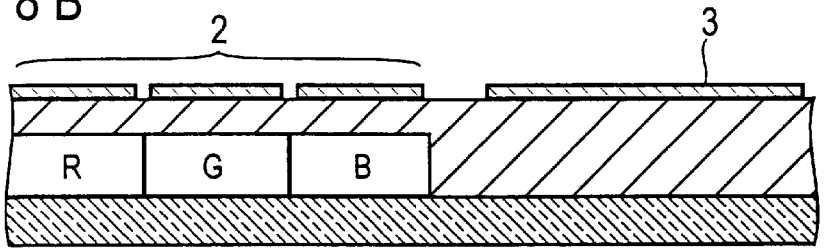

A transparent conductive film made of ITO and having a thickness of 1,000 Å was then formed by sputtering on the surface of the overcoat layer 11. A resist pattern was then formed by photolithography, the transparent conductive film was etched, and the resist was stripped off. Column lines made of ITO were formed in this way as shown in FIG. 8B, and became the first electrode 2. A terminal electrode 3 pattern was also formed at the same time. The taper angle (angle θ in FIG. 4B) at the side walls of the first electrode 2 and the terminal electrode 3 was 45°. Side walls having this taper angle were formed by 2 minutes of etching with an etchant composed of a mixture of HCl, $HNO_3$ and water.

Figure 8C:
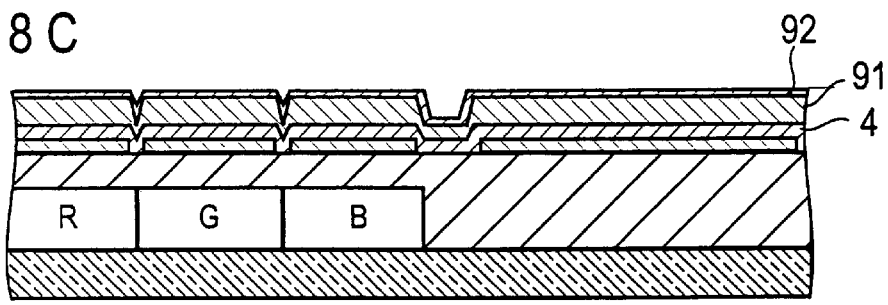

Next, an insulating layer 4 having a thickness of 0.2 μm was formed on the first electrode 2 by sputtering from a $SiO_2$ target, and an aluminum layer 91 having a thickness of 1 μm and a chromium layer 92 having a thickness of 0.2 μm were formed by sputtering, thereby giving the structure shown in FIG. 8C.

The chromium layer 92 and the aluminum layer 91 were then etched in the same way as in Example 1. Next, a pattern for exposing the surface of the first electrode 2 was subsequently formed by photolithography, the insulating layer 4 was etched so as to expose the light-emitting region and the terminal electrode 3, and finally the resist was removed. An etching liquid obtained by mixing hydrofluoric acid with aqueous ammonium fluoride in a 1:20 ratio was used to etch the insulating layer 4.

Figure 8D:
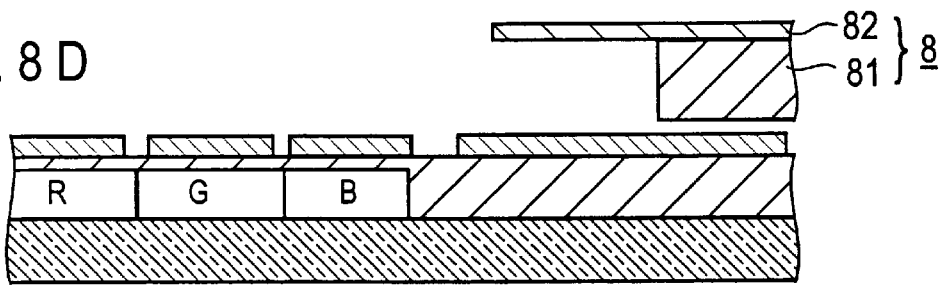
Figure 8E:
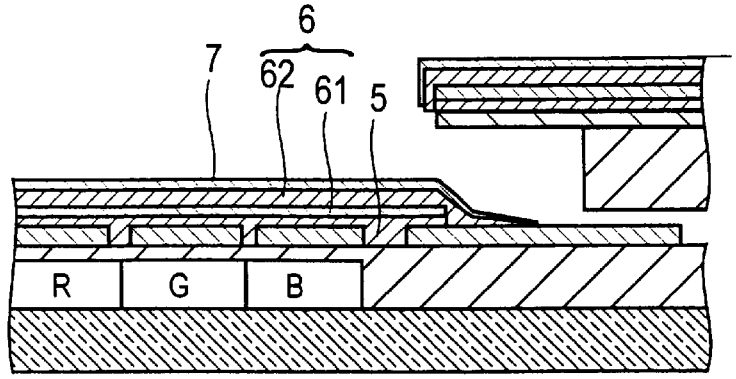

Next, as shown in FIG. 8D, a mask 8 similar to the mask 8 used in Example 1 was placed on the substrate 1, following which the workpiece was introduced into a film-forming apparatus, where an organic functional layer 5, a second electrode 6 (electrode layer 61 and interconnect layer 62), and a protective layer 7 were successively formed, thereby giving the structure shown in FIG. 8E. The vacuum was not broken until formation of the protective layer 7 was completed, nor was the mask 8 changed.

The organic functional layer 5 was composed of a hole injecting layer with a thickness of 100 Å, a hole transporting and yellow light-emitting layer with a thickness of 500 Å, a blue light-emitting layer with a thickness of 500 Å, and an electron transporting layer with a thickness of 100 Å, while the materials were selected so that the device might emit white light. The hole injecting layer was formed by the vapor deposition of poly(thiophene-2,5-diyl). The hole transporting and yellow light-emitting layer was formed by the co-deposition of TPD doped with 1% by weight of rubrene. A rubrene concentration of about 0.1 to about 10% by weight is preferable because the emission efficiency at this concentration is high. The concentration may be decided from the color balance between the colors of the emitted light, and is governed by the light intensity and wavelength spectrum of the blue light emitting layer which is formed next. The blue light emitting layer was formed by the vapor deposition of 4,4'-bis[(1,2,2-triphenyl)ethenyl]biphenyl. The electron transporting layer was formed by the vapor deposition of $Alq_3$.

The electrode layer 61 was formed to a thickness of 2,000 Å by the vapor deposition of a magnesium-silver alloy (weight ratio, 10:1). The pressure during vapor deposition was set at $1 \times 10^{-6}$ torr.

The interconnect layer 62 was formed to a thickness of 0.3 μm by sputtering from an aluminum target. The pressure of the sputtering gas was set at $4 \times 10^{-3}$ torr. The slope v/h at the end of the interconnect layer 62 shown in FIG. 4(A) was 0.05. The amount of argon in the interconnect layer 62 was about 3 atom %. The amount of argon in the electrode layer 61 was below the limit of detection.

The protective layer 7 was formed to a thickness of 0.2 μm by sputtering from a $SiO_2$ target.

This completed the fabrication of a simple matrix-type organic EL color display.

What is claimed is:

1. An organic electroluminescent display device comprising a luminescent laminate and a terminal electrode on a substrate surface, wherein said luminescent laminate has, in order, a first electrode, an insulating layer covering part of the first electrode, an organic functional layer including a light-emitting layer, and a second electrode comprised of at least one conductive layer, and said at least one conductive layer comprising the second electrode is an interconnect layer which is in contact with at least part of the terminal electrode, and which has a slope at the end of not more than 0.1, at least in the vicinity of the terminal electrode.

2. The organic electroluminescent display device of claim 1, wherein the interconnect layer contains argon and the organic functional layer contains substantially no argon.

3. A method of manufacturing an organic electroluminescent display device comprising a luminescent laminate and a terminal electrode on a substrate surface, wherein said luminescent laminate has, in order, a first electrode, an insulating layer covering part of the first electrode, an organic functional layer including a light-emitting layer, and a second electrode comprised of at least one conductive layer, and said at least one conductive layer of the second electrode is an interconnect layer in contact with the terminal electrode, said method comprising the steps of:

forming a first electrode, an insulating layer, and a terminal electrode, subsequently placing the substrate so that the surface side faces a mask having a shielding portion for restricting the layer-forming region and an opening surrounded thereby, forming an organic functional layer, then forming an interconnect layer by a process having better step coverage than the process used to form the organic functional layer such as to bring the interconnect layer into contact with at least part of the terminal electrode.

4. The method of manufacturing an organic electroluminescent display device of claim 3, wherein the substrate is placed on the mask in such a way that the shielding portion of the mask covers at least part of the terminal electrode across an intervening space.

5. The method of manufacturing an organic electroluminescent display device of claim 3, wherein the organic functional layer is formed by a vacuum evaporation process and the interconnect layer is formed by a sputtering process.

6. The method of manufacturing an organic electroluminescent display device of claim 3, wherein said at least one conductive layer comprising the second electrode is made of a metal having a work function of not more than 4 eV.

7. The method of manufacturing an organic electroluminescent display device of claim 4, wherein the organic functional layer is formed by a vacuum evaporation process and the interconnect layer is formed by a sputtering process.

8. The method of manufacturing an organic electroluminescent display device of claim 4, wherein said at least one conductive layer comprising the second electrode is made of a metal having a work function of not more than 4 eV.

9. The method of manufacturing an organic electroluminescent display device of claim 5, wherein said at least one conductive layer comprising the second electrode is made of a metal having a work function of not more than 4 eV.

* * * * *